United States Patent

[11] 3,587,166

[72] Inventors Earl Glynn Alexander;
Walter Richard Runyan, Dallas, Tex.
[21] Appl. No. 435,633
[22] Filed Feb. 26, 1965
[45] Patented June 28, 1971
[73] Assignee Texas Instruments Incorporated
Dallas, Tex.

[54] INSULATED ISOLATION TECHNIQUES IN INTEGRATED CIRCUITS
16 Claims, 17 Drawing Figs.

[52] U.S. Cl. ........ 29/577, 29/578, 148/175, 148/187, 156/17, 317/234
[51] Int. Cl. ........ B01j 12/00, H01l 1/16
[50] Field of Search ........ 29/25.3, .3 (R), 155.5 (G), (I); 148/1.5, 33, 33.2, 174, 175, 187, 33.5; 156/17; 317/234, 235 (Inquired), 101 (A)

[56] References Cited

UNITED STATES PATENTS

| | | | |
|---|---|---|---|
| 3,047,438 | 7/1962 | Marinace | 148/33.5X |
| 3,158,788 | 11/1964 | Last | 317/101 |
| 3,243,323 | 3/1966 | Corrigan | 148/175 |
| 3,247,428 | 4/1966 | Perri | 317/234 |
| 3,265,542 | 8/1966 | Hirshon | 148/175 |
| 3,290,753 | 12/1966 | Chang | 29/25.3 |
| 3,300,832 | 1/1967 | Cave | 29/25.3 |

OTHER REFERENCES

Electronics Review, Vol. 37, No. 17, June 1, 1964, Page 23.

*Primary Examiner*—John F. Campbell
*Assistant Examiner*—W. Tupman
*Attorneys*—Samuel M. Mims, Jr., James O. Dixon, Andrew M. Hassell, Harold Levine and John F. Vandigriff

ABSTRACT: A method of forming a circuit component in a region of low-resistivity semiconductor material that is located in but isolated from a semiconductor substrate by the formation of a region of high-resistivity semiconductor material of one conductivity type in this region of low-resistivity semiconductor material of the same type. A contact is made to this low-resistivity region of the circuit component which is normally inaccessible (buried) except by a final diffusion step by making ohmic contact to the surface of the low-resistivity region. Also disclosed is the structure formed thereby.

INVENTORS
EARL G. ALEXANDER
WALTER R. RUNYAN

INSULATED ISOLATION TECHNIQUES IN INTEGRATED CIRCUITS

This invention relates to integrated circuits, and more particularly to miniature electronic circuits of the type having all of the necessary circuit components joined together by a common substrate but yet are electrically isolated through the substrate.

There is substantial growth of interest in microminiaturization at the present time, especially in that area of electronics commonly referred to as "microelectronics." Within the semiconductor field in particular, this interest has been reflected by the rapid development of integrated circuitry. Generally speaking, the area of integrated circuits may be resolved into two broad classes. The first is referred to as the "chip approach" wherein individual components such as transistors, resistors, and diodes, are formed on separate pieces of semiconductor material, the separate components thereafter being mounted on an insulating substrate and interconnected in a single package to produce a circuit function. The second class, by far having the greatest potential in microelectronics due to the greater reliability in performance and substantial savings in cost and space, involves having all of the individual active and/or passive components formed on a single piece of semiconductor material, preferably a single crystal, the components being interconnected to perform the desired circuit function.

The formation of all components in one single crystal semiconductor substrate, however, presents the problem of electrically isolating the circuit components from one another. In particular, when a number of transistors are formed within one portion of the substrate, with the substrate forming the collector region, it is necessary for many circuit applications to isolate the transistors to avoid having the collectors commoned. In the "chip approach," isolation is achieved by separating the devices mechanically, but where all the components of a particular circuit are upon one semiconductor substrate, achieving adequate isolation is one of the principal problems.

Many techniques have been developed to solve this problem, all of them possessing certain disadvantages. One such process involves producing a series of islands of one conductivity-type semiconductor material within a substrate of opposite conductivity-type material, and biasing the substrate with respect to the rest of the circuit so that the junctions separating the islands from the substrate are never forward biased. The islands form the collectors of transistors, and subsequent diffusions are made into the islands to form the base and emitter regions. Chief among the problems associated with this technique, however, is the fact that the inherent capacitance of the isolation junctions produces undesirable coupling at high frequencies. Also, the circuits and biasing levels must be designed so as to insure that the isolation junctions are not forward biased at any time under normal operating conditions. Even if the junctions are maintained in a reverse biased condition, undesirable effects can result from the collection of carriers by the isolation junction.

Another technique for isolation involves having the isolation islands, in which the components are subsequently constructed, consist of the original wafer doping. Isolation is then achieved by selective diffusion of material of opposite conductivity type from each side of the wafer and completely through the wafer so that the diffusion fronts intersect. A disadvantage of this process is that the diffusions through the wafer require thin wafers and long diffusion times with high surface concentrations, resulting in high isolation capacitance.

There is presently known in the art a method of isolation referred to as "insulated isolation" which partially solves the above-mentioned problems. In accordance with this method, a series of mesas are etched upon one face of a monocrystalline semiconductor wafer. These mesas are then coated with an insulating medium, such as silicon oxide, and a thick layer of semiconductor material is subsequently grown over the top of the wafer so as to completely cover the oxide. The semiconductor wafer which forms the substrate, is then removed by lapping, leaving only the mesa regions supported by the grown semiconductor layer but isolated therefrom by the insulating material. Circuit elements such as transistors, resistors, or other appropriate devices are then formed in the unremoved monocrystalline portion of the mesa by the usual techniques, and will be electrically isolated from each other by the silicon oxide insulating medium. Although the process, as a whole, has proven to possess substantial advantages over other methods of isolation, problems are involved when the circuit elements to be formed are active devices. In particular, since the collector region of a transistor, being the unremoved portion of the monocrystalline substrate, is directly adjacent the insulating medium, subsequent electrical contact to be made to this region may conveniently be made only at the surface of the wafer. This restriction means that all the collector current must flow laterally through the lightly doped collector region to the collector contact made in the surface, and a very large collector-spreading resistance is consequently added.

To overcome this difficulty, it has been found that if a layer of low-resistive semiconductive material is located intermediate the collector region and the insulating medium, the collector current flow, particularly in the lateral direction, will encounter less opposition, the collector-spreading resistance thereby being lowered. In accordance with this objective, therefore, it has been the practice to incorporate an extra step in the "insulated isolatio" technique previously described, the slice of original monocrystalline material being initially subjected to a diffusion operation to produce a shallow low-resistive semiconductive region. The mesas are then etched, and the insulating medium and thick layer of semiconductor material formed as before. The difficulty with this approach, however, is encountered during the lapping step used to remove a portion of the substrate material. Since the operating characteristics of a transistor are largely dependent upon the width of the collector region, close control needs to be maintained over the amount of substrate material removed. However, due to the limitation on the tolerances that may be achieved by lapping, it is very difficult, if not impossible, to produce a collector region adjacent the low-resistive semiconductive region having precise dimensions. This difficulty is complicated even more by the bowing of the semiconductor wafer.

Another disadvantage associated with the process described above is the fact that the low-resistive semiconductive region will be buried within the wafer below the base and emitter regions, and a separate diffusion step will be required in order to make contact at the surface.

With these difficulties in mind, it is an object of this invention to provide an improved method of isolation whereby all of the necessary circuit components of an integrated circuit are joined by a common substrate and yet are electrically isolated through the substrate.

Another object of the invention is to provide a method of isolation in the production of integrated circuits by which close control may be maintained over the dimensions of the collector regions.

It is another object of the invention to provide a method of isolation in the production of integrated circuits by which a low series resistance semiconductor region is formed adjacent the collector region, thereby reducing the collector spreading resistance.

It is a still further object of the invention to form said low-resistance semiconductor region in a manner such that ohmic contact may be made to said region at the surface of the semiconductor wafer without the requirement of an extra diffusion step.

In accordance with these objects and other objects, features, and improvements to be described subsequently, the invention involves an improved method of isolation utilizing the broad concept of "insulated isolation" but eliminating the shortcomings that limit its use. Accordingly, in a preferred embodiment of this invention, a series of mesas are initially etched on the face of a wafer of low-resistivity semiconductor material. These mesas are then coated with an insulating medium, such as silicon oxide, for example, and a thick layer of semiconductor material is subsequently grown over the surface of the wafer so as to completely cover the oxide. A substantial portion of the substrate is then removed by lapping. The entire wafer is thereafter rotated 180°, and an oxide is placed upon the unremoved portion of the low-resistivity material. Using conventional photographic masking and etching techniques, the oxide is selectively removed so as to expose portions of the low-resistivity materials within the mesa regions. The entire wafer is then subjected to a vapor-etching process which selectively removes a portion of the low-resistivity material. Thereafter, using epitaxial techniques, a layer of high-resistivity monocrystalline semiconductor material is redeposited within the space left vacant by the selective vapor etch step. Into this layer subsequent diffusions may be made or epitaxial depositions carried out to form diode or transistor structures, for example. Since the high-resistivity layer which constitutes the collector region in a transistor, is formed by selective vapor etch and epitaxial deposition rather than by lapping, close control may be maintained over its dimensions. In addition, using the process of this invention, contact may be made directly to the low-resistivity layer at the surface of the wafer without the requirement of an extra diffusion step.

The novel features believed to be characteristic of this invention are set forth with particularity in the appended claims. The invention itself, however, as well as further objects and advantages thereof, may best be understood by reference to the following detailed description of illustrative embodiments, when read in conjunction with the accompanying drawings, wherein:

FIG. 1 is an isometric pictorial view in section of a semiconductor wafer in an early stage of the production of an integrated circuit in accordance with the process of this invention;

FIGS. 2—4 are elevational views in section of the semiconductor body of FIG. 1 in successive stages of production;

Figure 1:
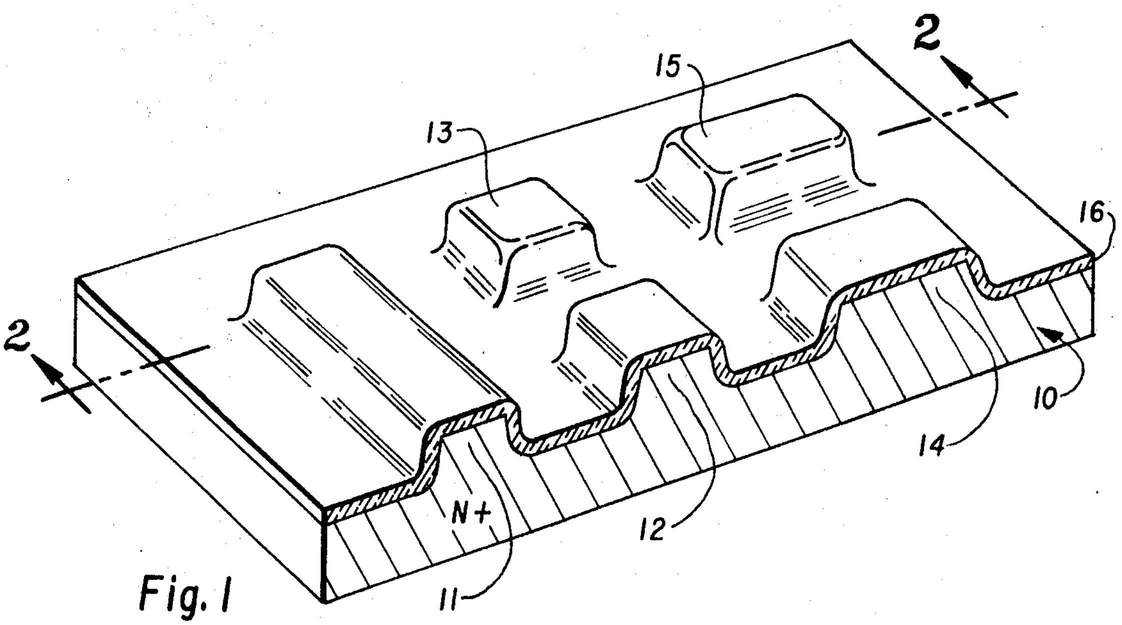
Figure 2:
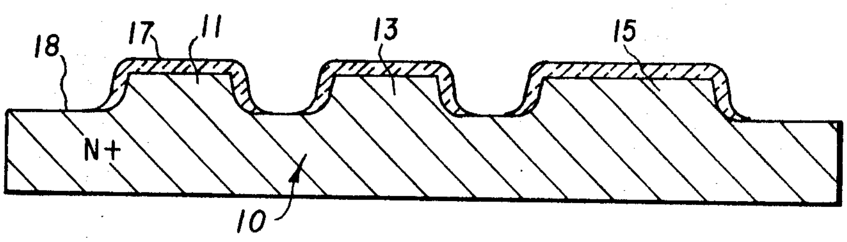

Referring now to FIG. 1, there is now described the first step in the method of this invention. A slice of single-crystal low-resistivity N+ semiconductor material, such as silicon, having a resistivity of perhaps 0.010 to 0.025 Ω/cm. is used as the starting material. This slice may be about 1 inch in diameter and 10 mils thick. A small segment of the slice may be represented as a chip or wafer 10, which represents the segment occupied by one integrated circuit. Actually, the slice would contain dozens or even hundreds of the segments such as the wafer 10. The top surface of the slice is first masked and etched to form a pattern of raised mesas 11—15. The masking may be by a material such as wax, or preferably by the photoresist techniques which permit excellent geometry control. The height of the mesas 11—15, or in other words the depth of the etching, may be about 2 mils. At this point the top surface of the slice is covered with an insulating coating 16, silicon oxide for example, which may be formed by any conventional technique to a thickness of perhaps 10,000 A. For instance, the coating 16 may be thermally grown by exposing the slice to steam at about 1,200° C. The mesas are now masked with photoresist and the oxide coating selectively removed in the surrounding areas by etching, leaving oxide layers 17 on each mesa, as seen in FIG. 2. Alternatively, the oxide coating 16 may be left on at this stage, the layers 17 being produced by a subsequent lapping operation. The top surface of the slice is then cleaned to remove all traces of oxide, organics from the photoresist, and other contaminants from the uncoated areas 18, and the slice is placed in an epitaxial reactor to produce the top layer which eventually becomes the substrate.

Figure 3:
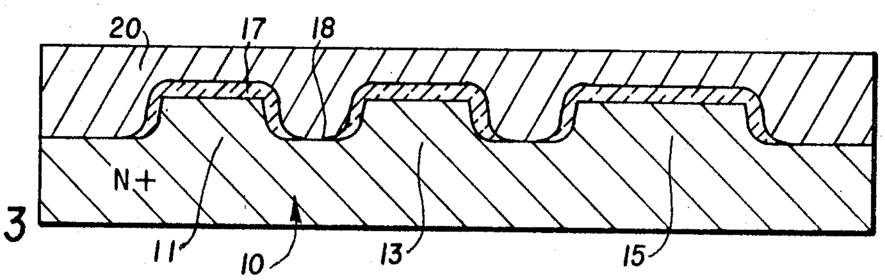

Within the reactor a layer 20 of semiconductor material is deposited over the top surface of the slice 10 as seen in FIG. 3. The most common method of vapor deposition is by the hydrogen reduction of silicon tetrachloride, a technique well known in the art and requires no elaboration here. This deposition as epitaxial growth begins in the areas 18 since the semiconductor material may not adhere to the silicon oxide layers 17. After the thickness of the grown layer reaches the tops of the mesas, however, subsequent growth will spread out and over the entire surface on the layered assembly. The conductivity type of the layer 20 is not critical as it may be N-type, P-type or intrinsic, and the thickness of the layer should be perhaps 7 or 8 mils or more to facilitate handling the unit without breakage.

Although one method of depositing the layer 20 has been described, this is by no means restrictive, as other methods well known in the art for depositing semiconductor material may be used in the process of this invention. Also, even though the term epitaxial has been used, implying a continuation of crystalline orientation from the slice to the grown layer, this need not be the case since the grown layer may also be either polycrystalline or amorphous, thereby increasing the isolation between elements even more.

Figure 4:
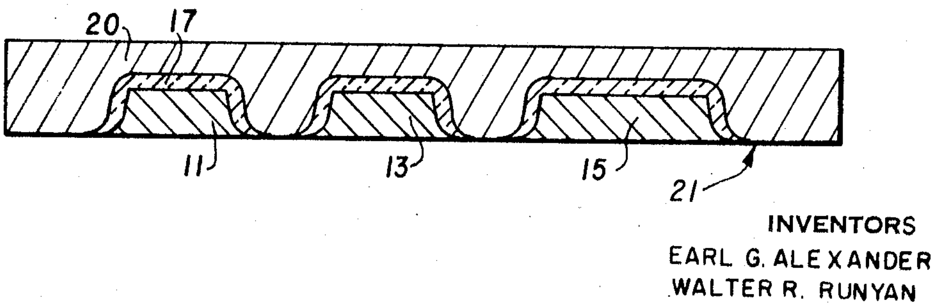

As the next step in the process of this invention the structure of FIG. 3 is subjected to a lapping and polishing treatment on its lower face to remove all of the original N+ material except that portion remaining within the mesas 11—15, as illustrated in FIG. 4. It is to be noted, as a particular aspect of this invention, that the degree of lapping is not critical, and although FIG. 4 depicts the surface or face 21 as being perfectly flat and the regions of unremoved N+ material within the mesas thereby being of identical depth, in practice it would be impractical, if not impossible to achieve such close tolerances. Moreover, since the dimensions of the N+ layers within the mesas 11, 13, and 15 do not seriously affect the operating parameters of the devices subsequently to be formed within these areas, there is no requirement for precise lapping.

Figures 5, 6, 7:
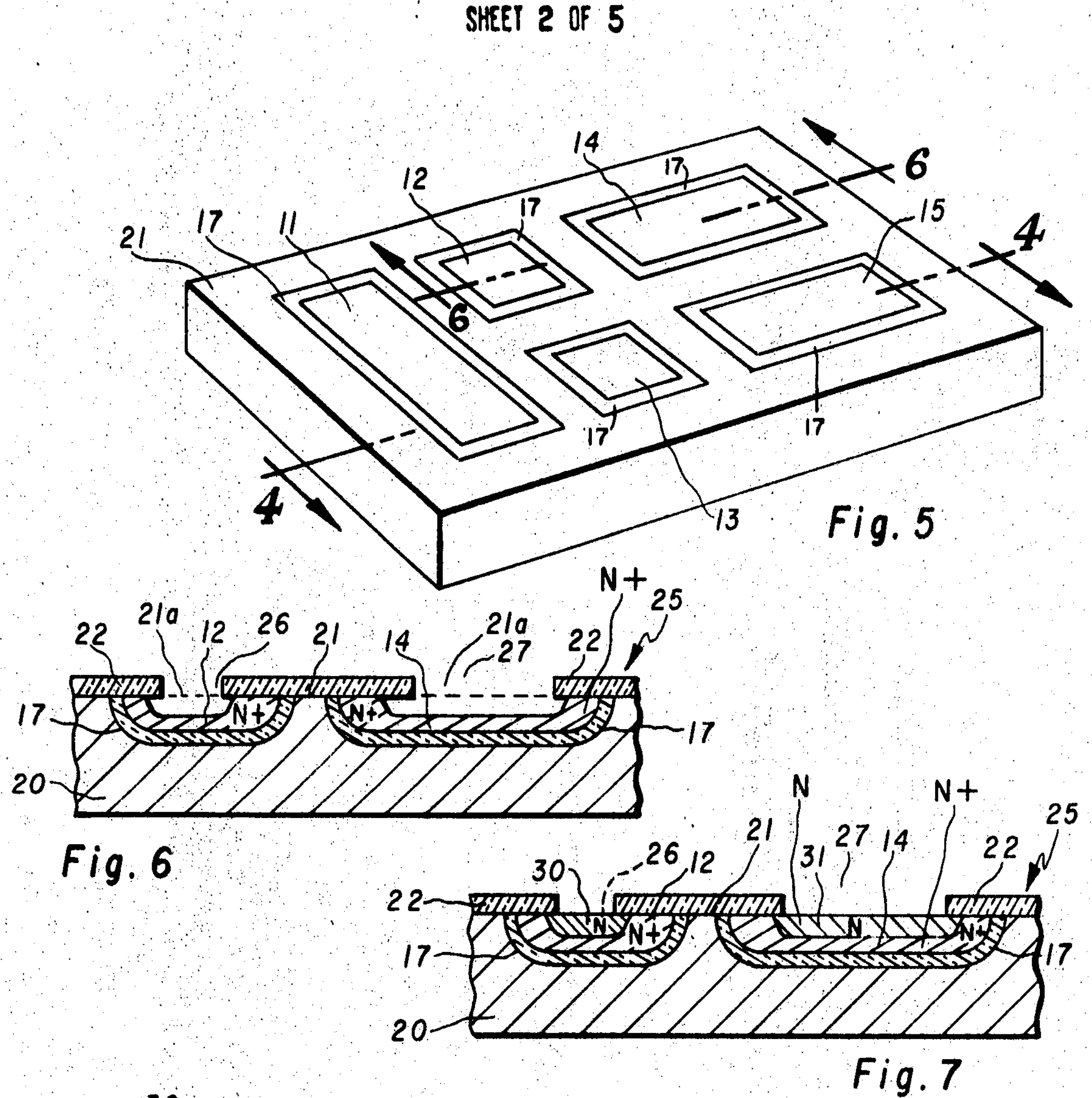
FIG. 5 is an isometric pictorial view of the lower side of the semiconductor body of FIG. 4.
FIGS. 6 and 7 are sectional views of a portion of the wafer of FIG. 5 taken along the line 6–6, showing subsequent steps of the process of this invention.

Inverting the device and looking at what was the bottom surface or face 21 of FIG. 4, but will now be considered the top face of the unit, the structure will appear as in FIG. 5. Each of the low-resistivity N+ monocrystalline portions 11—15 is insulated from the others and from the substrate or layer 20 by the silicon oxide coating 17. This oxide coating 17 is not shown to scale in the drawings, and would actually be perhaps an order of magnitude thinner in proportion than is shown in the sectional views of the drawings.

An oxide layer 22 is then formed upon the upper surface or face 21 of the wafer 25, as depicted in FIG. 6. The oxide layer, which might be silicon oxide for example, should preferably be of a thickness in excess of 10,000 A, and may be formed by any conventional technique. For example, it ma be thermally grown by heating the entire structure to a temperature of approximately 1,200° C. in the presence of oxygen.

An alternative method of forming the oxide layer 22, however, would be the "oxidative" technique, by which oxygen and tetraethoxysilane are reacted in vapor form at 250—500° C. The reaction mixture is obtained by bubbling oxygen through liquid tetraethoxysilane at room temperature, then combining the gaseous mixture with excess oxygen and passing it into a furnace tube containing the wafer 25 where the oxidation takes place. The silicon oxide thereby produced is deposited upon the upper surface or face 21. A typical reaction condition for the oxidative method involves, by way of example, a flow rate of 1 cubic foot of oxygen per hour into the liquid tetraethoxysilane. The reaction mixture is then mixed with excess oxygen, also at a rate of one cubic foot per hour, and passed into the tube. At 500° C. in a 2-inch diameter quartz furnace tube, excellent deposits of silicon oxide are formed at rates from 1,300—1,400 A. per hour. The advantages of this process is the relatively low temperatures at which uniform oxide coatings can be formed.

Through the use of photographic masking and etching techniques, for example, a select portion of the oxide layer 22 is removed so as to expose corresponding portions of the low-resistivity semiconductor regions 12 and 14 within the apertures or windows 26 and 27, respectively. This removal may be accomplished by covering the oxide layer 22 with photoresist, exposing and developing the photoresist, and etching away the unmasked areas of the oxide. By this method, the oxide mask shown in section in FIG. 6 is produced directly on the substrate surface 21. The mask thus produced will limit the area of the substrate that is to be affected by the subsequent vapor etch and epitaxial redeposition steps.

As the next step in the process of the present invention the wafer 25 is subjected to a selective vapor etch which removes select portions of the low-resistivity regions 12 and 14 below the dotted line **21*a*, as observed in FIG. 6. The wafer 25 is thereafter subjected to an epitaxial deposition step whereby, as shown in FIG. 7, regions 30 and 31 of high resistivity N-type semiconducting material are redeposited within the vacant space produced by the vapor etch step previously described. The N-type regions 30 and 31 are formed adjacent the low-resistivity N+ regions 12 and 14, also depicted in FIG. 7**.

In practicing the invention, various desired arrangements may be utilized as well as various techniques applied in order to accomplish the steps of vapor etching and epitaxially redepositing within the unmasked regions. In particular, however, it is desirable to use a process which brings the transformation from an etching condition to a depositing condition as smoothly as possible and with a minimum of cost. In line with this objective, therefore, there is presently described a process whereby the wafer 25 is placed within a reactor whose reactor constituents, during etching, are substantially the same as those during the epitaxial deposition. The basic formula for this operation is $SiCl_4+2H_2 \overset{\Delta}{\rightleftarrows} 4HCl+Si$. This reaction is forced to the left by the addition of an excess of HC1, thus creating an etching condition. To change from an etching condition to one of deposition, (i.e., when the reaction proceeds to the right) merely calls for the termination of the HC1 flow which, in turn, brings about a gradual change from an etching condition to one of deposition.

Figure 8:
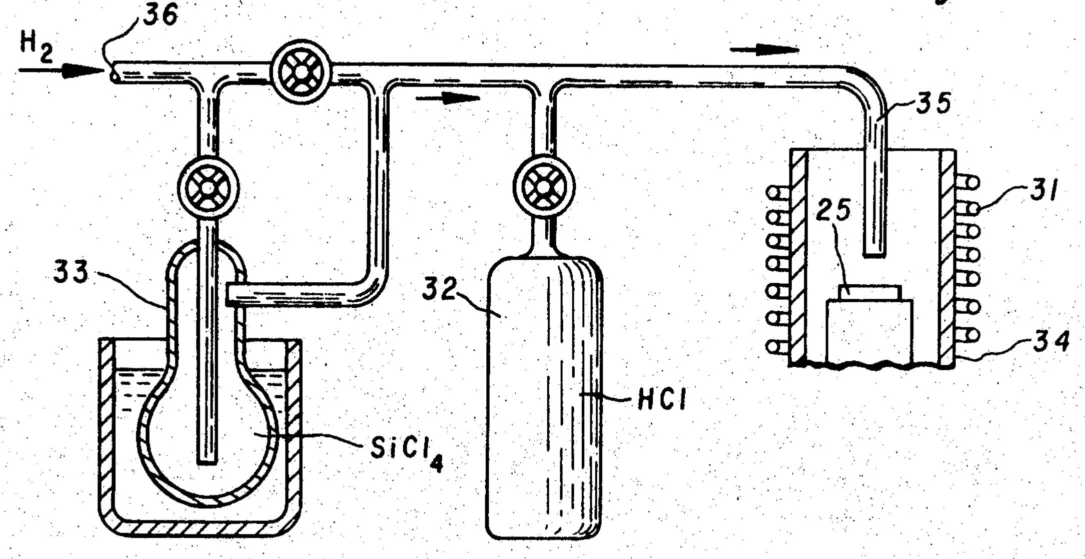
FIG. 8 is a front elevation, partly in section, of one form of apparatus used in the process of this invention.

Referring to FIG. 8, apparatus for etching and redepositing in accordance with this process comprises a reactor in the form of a tube 34 having heating coils 31. The furnace may be of a horizontal or vertical type, may be suited for single or multiple slices, and may be either resistively or inductively heated. Silicon slices including the wafer 25 are disposed within the furnace is such a position as to expose the slices to gases directed into the tube through a conduit 35. The hydrogen chloride and the silicon tetrachloride vapor are respectively introduced into the conduit 35 from a cylinder 32 containing anhydrous hydrogen chloride and from flask 33 containing liquid silicon tetrachloride, through which hydrogen gas is bubbled. The vapor pressure of the silicon tetrachloride is controlled by submerging the flask 33 in an ice bath. Purified dried hydrogen enters end 36 of the conduit. The flow of the gasses into the tube furnace 34 is regulated by conventional valves.

With the valves adjusted so that an excess of hydrogen chloride vapor is introduced into the reactor, the wafer 25 will be subjected to a selective vapor etch. While the oxide mask 22 will be substantially unaffected, select portions of the low-resistivity N+ substrate regions 12 and 14 are removed as shown in FIG. 6. The etchant itself will comprise a mixture of silicon tetrachloride, hydrogen chloride, and hydrogen. Alternatively, the valve controlling the flow of silicon tetrachloride may be closed, and an etchant comprising hydrogen chloride and hydrogen may successfully be used to remove the silicon substrate. The rate of etching as well as the dimensions of the etched regions will be determined largely by the configuration and size of the oxide masking 22, as will be observed by a comparison of the area of substrate removed below the aperture 26 with the substrate removed below the aperture 27. Other factors that will affect the rate of etching are the temperature at which the reactor is maintained, the flow rate through the conduit 35, and the percentage composition of the etchant. For example, for one particular configuration of the oxide mask 22, when the flow rate was kept at 15 liters/minute, the temperature at approximately 1,200° C., and the etchant consisted of 95 percent H2 and 5 percent HC1, the silicon regions 12 and 14 etched at a rate of approximately 3 microns/minute.

After the desired amount of the low-resistivity silicon has been removed from the wafer by the above-described process, the valves are closed to terminate the flow of the hydrogen chloride, the gas flow through the conduit 35 then consisting of hydrogen and silicon tetrachloride. Doping impurities may be introduced into the gas stream by placing an appropriate impurity-containing compound, such as a halide of phosphorous, into the flask 33, or in a similar flask if a different temperature is required, With this arrangement, and due to the hydrogen reduction of the silicon tetrachloride, lightly doped N-type silicon is deposited upon the slice 25 within the apertures 26 and 27 and grows epitaxially upon the N+ silicon region 12 and 14. The deposition will continue until the regions 30 and 31 of the lightly doped N-type silicon are formed within the vacant areas previously produced by the vapor etch step and adjacent the N+ regions 12 and 14 respectively, as shown in FIG. 7.

Although a particular method and particular materials have been described in selectively removing the N+ low-resistivity substrate material and epitaxially redepositing the N-type material, any variations of the materials or the techniques may be utilized as long as the broad concept of selective vapor etch and epitaxial redeposition is employed. Using this concept, close control may be maintained over the dimensions and the configuration of the N-type regions. In addition, it is to be observed from FIG. 7 that contact may be made to the N+ regions 12 and 14 at the surface of the wafer 25 by cutting through the oxide layer 22 without the necessity of a subsequent diffusion step to reach these regions. As mentioned previously, the N+ layer 12 or 14 allows better low-resistance contact to be made to the underside of the N-type region 30 or 31 which serves as one of the active regions of a component in an integrated circuit, for instance the collector region of a transistor.

Also to be noted as a feature of the invention is that the selective vapor etch step furnished two complementary results. In addition to removing the low-resistivity N+ substrate as described, it thoroughly cleans the silicon oxide mask 22, thus avoiding undesirable silicon overgrowth on the oxide during the subsequent deposition step, and it also removes contaminants from the surface of the N+ regions upon which the N-type silicon is epitaxially deposited.

Figure 9:
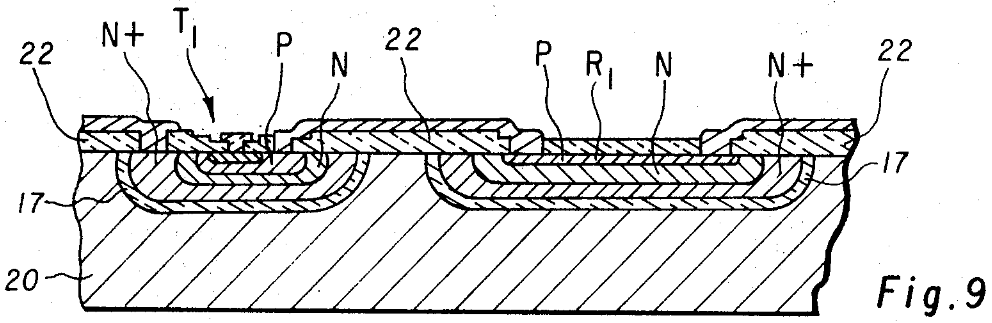
FIG. 9 is the same sectional view as FIG. 6 and 7 after diffusion operations have been completed and interconnections have been applied.
Figure 11:
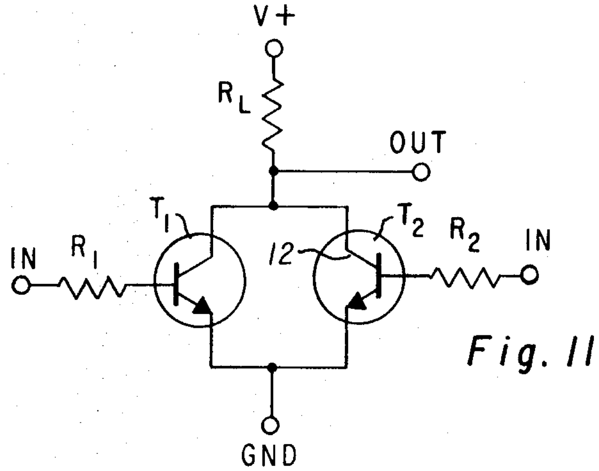
FIG. 11 is a schematic diagram of the integrated circuit contained within the device of FIG. 10.
Figure 10:
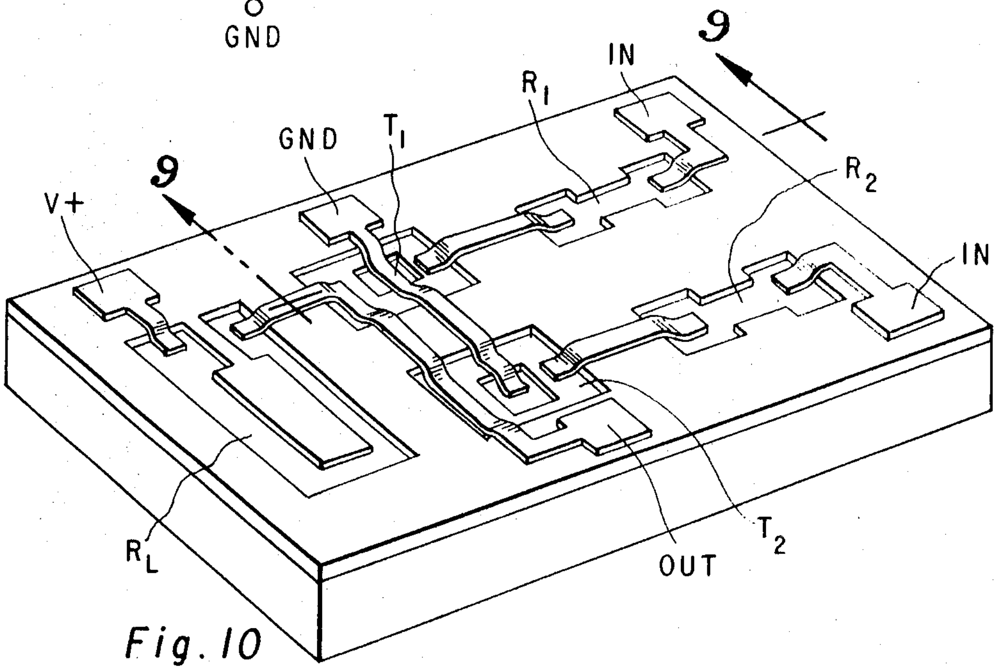
FIG. 10 is an isometric pictorial view of the completed device described with reference to FIGS. 1—9.

Referring back to FIG. 7, it will be observed that the layers 30 and 31 may now serve as active regions into which subsequent diffusions, or upon which epitaxial depositions, may be made in order to fabricate various components of an integrated circuit. Referring now to FIG. 9, a sectional view of a completed integrated circuit is seen, with an NPN transistor $T_1$ and a resistor $R_1$ having been formed in the N-type redeposited regions 30 and 31 by diffusion. A P-type diffused region provides the base of the transistor, while an elongated P-type region formed simultaneously with the base provides the resistor $R_1$. N-type diffused regions provide the transistor emitters. The diffusion operations utilize silicon oxide masking so that the oxide layer 22 acquires a stepped configuration in the final device. Openings are made in the oxide where contact is necessary, then metal film is deposited over the oxide and selectively removed to provide the desired contacts and interconnections. The completed unit is seen in FIG. 10, with the transistors $T_1$ and $T_2$ and the resistors $R_1$, $R_2$ and $R_L$ along with the metal film interconnecting providing a logic circuit as seen in schematic form in FIG. 11.

The versatility and utility of the process of this invention, and in particular the selective vapor etch and epitaxial redeposition steps, allow the fabrication of these discrete circuit components within a single wafer and yet electrically isolated from each other. This may be further illustrated by the following description, in which an NPN transistor, a PNP transistor, a diode, and a resistor are formed within one segment of a wafer.

Figure 12:
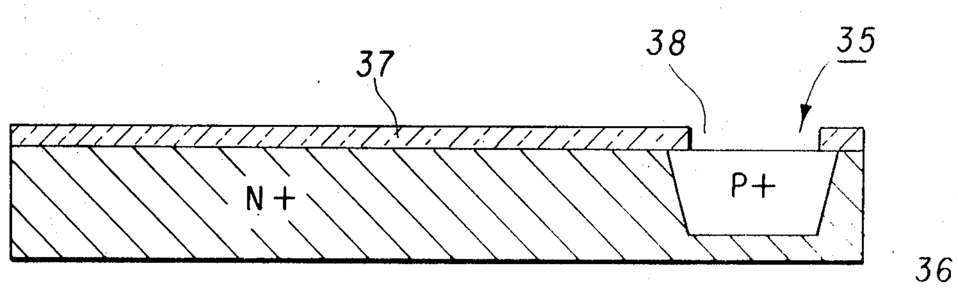
FIGS. 12—17 are sectional views of a semiconductor wafer showing subsequent steps in the manufacture of an integrated circuit having several circuit components joined by a common substrate but electrically isolated through the substrate.

Referring to FIG. 12, the first step in this fabrication is the formation of a thin oxide layer 37 over the low-resistivity N+ silicon substrate 36 of wafer 35. Using photographic masking and etching techniques, for example, an aperture 38 is formed exposing a portion of the underlying silicon. The wafer is then subjected to an etching process by which a quantity of N+ silicon, defined by the outline is removed. This etching may be achieved by the vapor etch process of the present invention, or alternatively, by any conventional chemical etching technique which does not substantially affect the oxide mask 37. The wafer is then placed in an epitaxial reactor such as the one shown in FIG. 8, and P+ silicon is deposited within the vacant space created by the etching step. The P-type conductivity of the silicon may be produced by introducing a halide of boron, for instance, into the flask 33. After the P+ silicon has been formed within the wafer 35 as depicted in FIG. 12, the entire wafer is subjected to hydrogen fluoride to completely remove the oxide mask 37, this removal having a negligible effect on the silicon material underneath.

Figure 13:
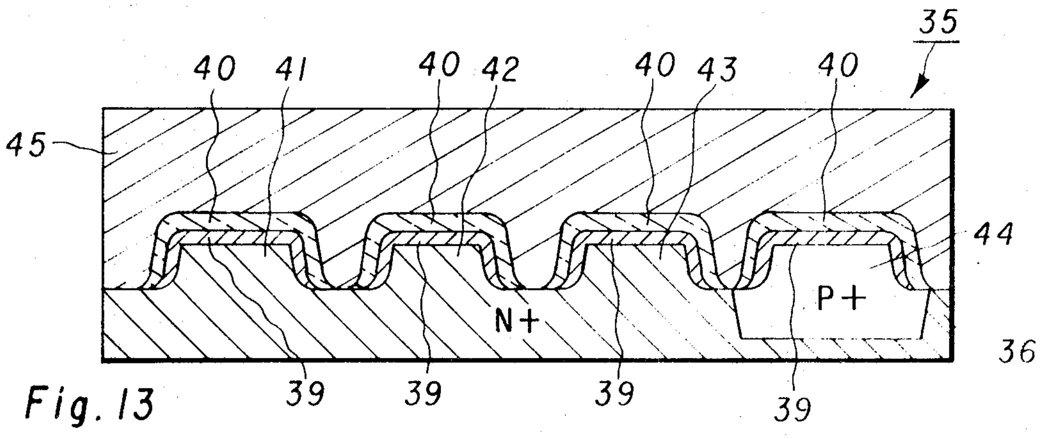

As the next step in the fabrication, a series of mesas 41—44 are etched upon the surface of the wafer 35. The insulating oxide layers may now e formed upon the mesas as previously described. As an alternative, however, it may be desirable first to deposit, by conventional techniques, a layer 39 of metal, such as molybdenum or tungsten, as shown in FIG. 13. Being adjacent the low-resistivity substrate, the metal layer has the effect of further lowering the resistance in this area. The silicon oxide layer 40 is then formed over the metal layer 39, and the two layers are selectively removed in all regions except over the mesas 41—44, as shown in FIG. 13. The semiconductor material 45 is then grown over the entire top surface of the wafer 35, as heretofore described.

Figure 14:
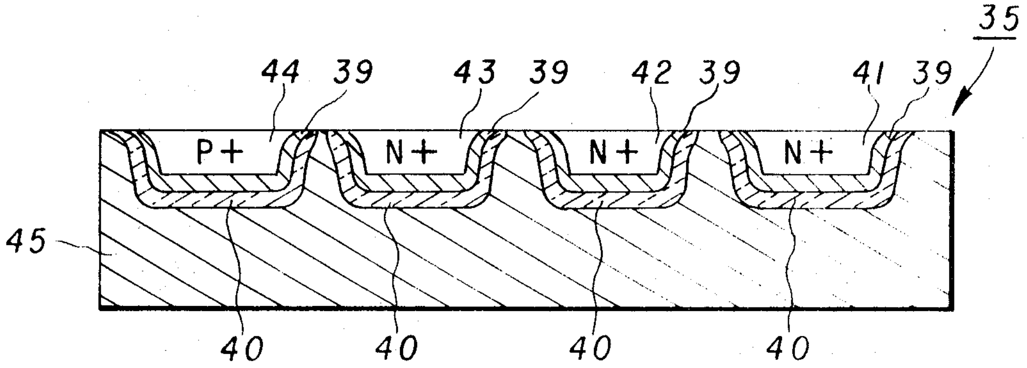

The structure of fIG. 13 is then subjected to a lapping and polishing step, whereby the substrate material is removed except for the portions making up the mesas 41—44, and the device is rotated 180°. The resulting structure is depicted in FIG. 14 where the low-resistivity P+ region at the location 44 is electrically isolated from the low-resistivity N+ regions at the locations 41, 42 and 43 which are electrically isolated from each other.

Figure 15:
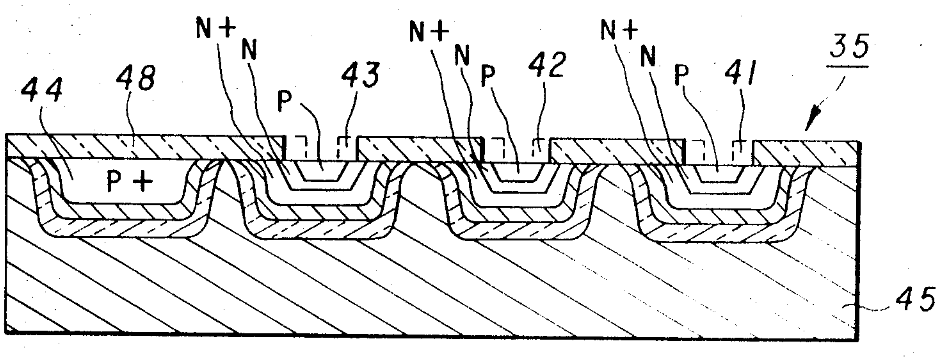
Figure 16:
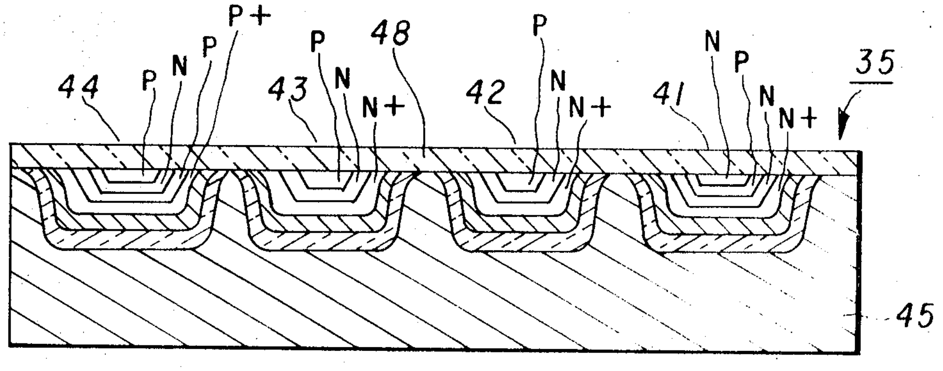
Figure 17:
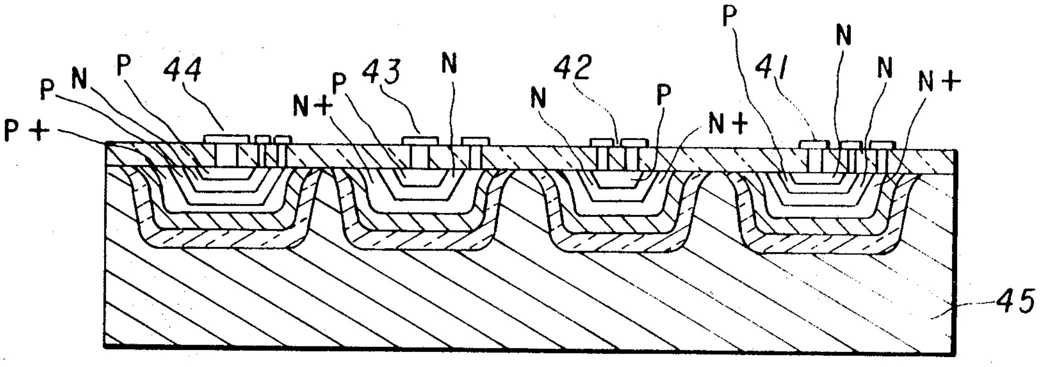

The wafer 35 now has an oxide mask 48 formed upon the surface, as depicted in FIG. 15, and the wafer is then subjected to the selective vapor etch and epitaxial redeposition steps which from the essence of the invention and which have been previously described in connection with FIGS. 6—8. After the N-type regions are formed at the locations 41—43, the oxide mask 48 may be altered at these locations to form the configuration represented by the dotted lines, and another series of selective vapor etch and redeposition steps are utilized to produce regions of P-type silicon above the N-type layers. Similarly, through the use of subsequent oxide masking, selective vapor etching and the redeposition of silicon having different types of doping, or by conventional N- and P-type diffusions, the structure of FIG. 16 is produced where a PNP transistor is formed at location 44, a P-N diode at location 43, a resistor at location 42 and an NPN transistor at location 41, all of these components being joined by a common substrate 45 but yet electrically isolated through the substrate. The oxide layer 48 is then selectively cut away and ohmic contacts and in interconnections deposited in the form of metal film at the desired locations as shown in FIG. 17.

Although specific integrated circuit structures have thus been described, it is obvious that using the method of this invention, a multitude of configurations of circuit components may be formed within one substrate. The use of the selective vapor etch, along with other advantages, accomplishes the cleaning of the oxide and substrate at the same time it etches away a prescribed portion of the silicon, thus avoiding two steps. The dimensions of the active regions of the various circuit components may be closely controlled by the combination of the vapor etch and epitaxial redeposition, thus increasing the reliability of the device.

While the invention has been described with reference to specific methods and embodiments, it is to be understood that this description is not to be construed in a limiting sense. Various modifications of the disclosed embodiments, as well as other embodiments of the invention, may be come apparent to persons skilled in the art without departing from the spirit and scope of the invention as defined by the appended claims.

We claim:

1. In a method for fabricating a circuit component within a region of low-resistivity of one conductivity type semiconductor material contained in a substrate and electrically isolated from said substrate, the steps of:

a. forming an insulating layer intermediate the region of low-resistivity semiconductor material and said substrate, b. forming a mask on a selected portion of said substrate adjacent said region of low-resistivity semiconductor material, thereby to expose a selected portion of said material, c. removing a predetermined amount of said selected portion of said material while leaving a portion of said material including a surface portion thereof, and d. depositing higher-resistivity semiconductor material of said one conductivity type substantially within the space occupied by said removed material.

2. The method as defined by claim 1 wherein said predetermined amount of said selected portion of said material is removed by applying a vapor etch to said selected portion of said material, and wherein said high-resistivity semiconductor material is deposited by epitaxial deposition.

3. A method for fabricating individual circuit components within a semiconductor body, said components being electrically isolated from each other through the body, comprising the steps of:

a. forming a plurality of mesa regions upon one surface of a wafer of low-resistivity semiconductor material, b. forming a layer of insulating medium over each of said mesa regions, c. depositing semiconductor material upon said insulating medium, thereby to completely cover said insulating medium;

d. removing substantially all of said low-resistivity semiconductor material from the opposite side of said wafer except the portions which form the mesa regions, e. forming a mask on selected portions, the surface of said body formed by said removal of substantially all of said low-resistivity semiconductor material adjacent said mesa regions said mask having a plurality of openings exposing selected portions of said mesa regions, f. applying an etch to said mask and said selected portions of said mesa regions for a period of time sufficient to remove predetermined amounts of low-resistivity semiconductor material forming the mesa regions, g. epitaxially depositing regions of higher resistivity semiconductor material within the spaces formed by the removal of said amounts of said low-resistivity semiconductor material, and h. forming individual circuit components within said regions of high-resistivity semiconductor material.

4. In a method for fabricating a semiconductor device, the steps of:

a. forming a substrate of a semiconductor material containing a region of low-resistivity semiconducting material of one conductivity type adjacent one face thereof but isolated therefrom by an insulating layer intermediate the region of low resistivity semiconducting material and said substrate, b. forming a mask on said one face of said substrate and over a part of said region of low-resistivity semiconducting material, thereby to expose the surface of a selected portion of said region, c. removing a predetermined amount of said selected portion, and d. depositing higher resistivity semiconducting material of said one conductivity type substantially within the space previously occupied by the removed material.

5. A method for fabricating individual circuit components within a semiconductor body, said components being electrically isolated from each other through the body, comprising the steps of:

a. forming a plurality of mesa regions upon one surface of a wafer of low-resistivity semiconductor material, b. forming a layer of insulating medium over each of aid mesa regions, c. depositing semiconductor material upon said insulating medium, thereby to completely cover the layer of said insulating medium;

d. removing substantially all of said low-resistivity semiconductor material except the portions which form the mesa regions, e. forming a mask on the surface of said body formed by said removal of substantially all of said low-resistivity semiconductor material adjacent said mesa regions said mask having a plurality of openings exposing selected portions of said mesa regions, f. applying an etch to said mask and said selected portions of said mesa regions for a period of time sufficient to remove predetermined amounts of low-resistivity semiconductor material forming the mesa regions, g. epitaxially depositing regions of higher resistivity semiconductor material within the space formed by the removal of said amounts of said low-resistivity semiconductor material, h. forming individual circuit components within said regions of high-resistivity semiconductor material, and i. applying ohmic contacts to the regions of low-resistivity semiconductor material at said surface of said body.

6. A method for fabricating individual isolated circuit components within a semiconductor body comprising:

a. forming a first masking layer over one surface of a wafer of low-resistivity semiconductor material having conduction carriers of one type, b. selectively removing at least one portion of said first masking layer so as to expose a corresponding at least one portion of said wafer of low-resistivity semiconductor material, c. removing a predetermined amount of the at least one exposed portion of said wafer, thereby to remove said predetermined amount of the exposed portion of said wafer, d. epitaxially depositing a region of low-resistivity semiconductor material substantially within the space formed by the removal of said amount of said at least one exposed portion of said wafer, said region being within and having majority conduction carriers of opposite type to said wafer of low-resistivity semiconductor material, e. forming a plurality of mesa regions upon said one surface of the said wafer at least one of said mesa regions is of low-resistivity semiconductor material having majority conduction carriers of opposite type, f. forming individual layers of insulating medium over said mesa regions, g. depositing semiconductor material upon said insulating medium and upon the surrounding areas, thereby to completely cover the layers of said insulating medium, h. removing substantially all of the low-resistivity semiconductor material the opposite surface of said wafer except the portion which forms the mesa regions, i. forming a mask on selected portions of the surface of said body formed by said removal of substantially all of said low-resistivity semiconductor material adjacent said mesa regions of low-resistivity semiconductor material, thereby to expose selected portions of said mesa regions only having conduction carriers of one type, j. applying an etch to said mask and said selected portion of said mesa regions only having conduction carriers of one type for a sufficient period to remove predetermined amounts of low-resistivity semiconductor material having conduction carriers of said one type which form certain of the mesa regions, k. epitaxially depositing regions of higher resistivity semiconductor material having conduction carriers of said one type within the space occupied by said removed material, l. forming a mask on selected portions of the surface of said body adjacent said mesa regions of low-resistivity semiconductor material, thereby to expose selected portions of at least one of said mesa regions only having conduction carriers of opposite type, m. applying a vapor etch to said insulating mask and said selected portion of said mesa regions only having conduction carriers of opposite type for a sufficient period to remove predetermined amounts of low-resistivity semiconductor material having conduction carriers of opposite type which form at least one of said mesa regions, n. epitaxially depositing regions of higher resistivity semiconductor material having conduction carriers of opposite type within the space formed by said removed material, and o. forming individual circuit components within each of said regions of higher resistivity semiconductor material.

7. The method as defined in claim 1 including the step of forming an ohmic contact on said surface portion of said region of low-resistivity semiconductor material.

8. The method as defined in claim 7, including the steps of forming a transistor in the deposited higher resistivity material with the deposited higher resistivity material being the collector and said ohmic contact being the collector contact.

9. A method of fabricating circuit components within an integral body, said components being electrically isolated from each other through the body, comprising the steps of: forming a plurality of low-resistivity semiconductor mesa regions of one conductivity type upon the same surface of semiconductor wafer, forming an insulating layer over each of said mesa regions, providing a support upon said insulating layer over said mesa regions, removing said semiconductor wafer to leave a predetermined surface including said mesa regions separated from one another on said predetermined surface, removing portions of said mesa regions to leave spaces in said regions with portions of said mesa regions remaining at said predetermined surface, depositing higher resistivity semiconductor material of said one conductivity type in said spaces and forming circuit components in said higher resistivity semiconductor material.

10. A method of fabricating circuit components within a semiconductor body, said components being electrically isolated from each other through the body, comprising the steps of: forming a plurality of low-resistivity semiconductor mesa regions of one conductivity type upon the same surface of a semiconductor wafer, forming an insulating layer over each of said mesa regions, providing a support upon said insulating layer over said mesa regions, removing said semiconductor wafer to leave a predetermined surface including said mesa regions separated from one another on said predetermined surface, removing portions of said mesa regions to leave spaces in said regions with portions of said mesa regions remaining at said predetermined surface, depositing higher resistivity semiconductor material of said one conductivity type in said spaces, forming at least one base region of opposite conductivity type within at least one of said higher resistivity semiconductor material regions, forming an emitter region of said one conductivity type within said at least one base region, and attaching a collector ohmic contact to the low resistivity material adjacent said at least one of said higher resistivity semiconductor material regions on said predetermined surface.

11. A method of fabricating circuit components within an integral body, said components being electrically isolated from each other through the body, comprising the steps of: forming a plurality of low-resistivity semiconductor regions of one conductivity type upon the same surface of the semiconductor wafer, forming an insulating layer over each of said mesa regions, providing a support on said insulating layer over said mesa regions, removing said semiconductor wafer to leave a predetermined surface including said mesa regions separated from one another on said predetermined surface, removing portions of said mesa regions to leave spaces in said regions with portions of said mesa regions remaining at said predetermined surface, depositing higher resistivity semiconductor material of said one conductivity type in said spaces, forming individual circuit components in said higher resistivity semiconductor material and attaching an ohmic contact to at least one of the portions of said mesa regions of low resistivity remaining at said predetermined surface.

12. A method of forming a plurality of semiconductor devices comprising the steps of etching away portions of substrate-supported, electrically isolated islands of monocrystalline semiconductor material suitably doped with a high concentration of impurities of one conductivity type which forms regions having low-impedance characteristics, leaving remaining portions of said islands of monocrystalline semiconductor material having a substantially cup-shaped configuration; epitaxially growing in said cup-shaped islands regions of monocrystalline semiconductor material having lower concentrations of impurities and of the same-type conductivity as said islands; forming at least one region of the opposite type conductivity from said one-type conductivity in each of said epitaxially grown regions of monocrystalline semiconductor material; and forming individual electrical contacts to said regions of high concentration of impurities and said formed regions in said epitaxially grown region.

13. A method of forming a plurality of semiconductor devices in accordance with the method of claim 12 wherein said monocrystalline semiconductor material comprises silicon.

14. A method of forming a plurality of semiconductor devices comprising the steps of forming a grid of channels in a surface of monocrystalline semiconductor substrate suitably doped with a high concentration of impurities of one type of conductivity to form regions having low-impedance characteristics; forming material on the surface of said monocrystalline semiconductor substrate and on the grid of channels formed in said substrate, a portion of said formed material being of the electrically insulating type and in contact with said substrate including the bottom portions of the grid of channels formed in said substrate; removing a portion of said monocrystalline semiconductor substrate to form electrically isolated islands containing said regions of monocrystalline semiconductor material of low-impedance characteristics; etching away portions of the exposed islands of monocrystalline semiconductor material of low-impedance characteristics to leave thin cup-shaped portions; epitaxially growing regions of monocrystalline semiconductor material having lower concentrations of impurities but of the same conductivity as said regions of semiconductor material of low-impedance characteristics on the inner surfaces of said cup-shaped portions; and forming at least one region of the opposite-type conductivity from said type of conductivity of the epitaxially grown semiconductor material thereby providing a plurality of individually electrically isolated semiconductor devices in a single substrate.

15. A method of forming a plurality of semiconductor devices comprising the steps of forming a grid of channels in a surface of a monocrystalline semiconductor substrate suitably doped with a high concentration of impurities of one type of conductivity to form regions having low-impedance characteristics; forming a layer of electrically insulating material on the surface of said monocrystalline semiconductor substrate and on the grid of channels formed in said substrate; growing a supporting layer of material on said insulating layer, said supporting layer of material having a coefficient of expansion substantially similar to the coefficients of expansion of said layer of electrically insulating material and said monocrystalline substrate; removing a portion of said monocrystalline semiconductor substrate to form electrically isolated islands containing said regions of monocrystalline semiconductor material of low-impedance characteristics; etching away portions of the exposed islands of monocrystalline semiconductor material of low-impedance characteristics to leave thin cup-shaped portions; epitaxially growing regions of monocrystalline semiconductor material having lower concentrations of impurities but of the same-type conductivity as said regions of semiconductor material of low-impedance characteristics on the inner surfaces of said cup-shaped portions; and forming at least one region of the opposite-type conductivity from said type of conductivity of the epitaxially grown semiconductor material thereby providing a plurality of individually electrically isolated semiconductor devices in a single substrate.

16. A method of forming a plurality of semiconductor devices comprising the steps of forming a first layer of an oxide of silicon on a surface of a monocrystalline silicon substrate suitably doped with a high concentration of impurities of one type of conductivity to form a subcollector region of low-impedance characteristics; photolithographically coating etch-resistant material on portions of said silicon oxide layer to form a grid pattern thereon; etching away the portions of said silicon oxide layer not covered by said etch-resistant material to form a grid of channels in said silicon oxide layer; etching a grid of channels in the monocrystalline silicon substrate through the grid of channels in said silicon oxide layer; forming a second layer of an oxide of silicon of the surface of said first silicon oxide layer located on said monocrystalline silicon substrate and on the grid of channels formed in said substrate; growing a supporting layer of polycrystalline silicon on said second silicon oxide layer, removing a portion of said monocrystalline silicon substrate and the portion of said silicon oxide layer originally formed on the bottom of said channels in said monocrystalline silicon substrate thereby exposing portions of said polycrystalline silicon layer and forming islands containing subcollector regions of monocrystalline silicon, forming a mask comprising a third layer of an oxide of silicon over the exposed portions of said polycrystalline silicon layer and over peripheral portions of the exposed islands of monocrystalline silicon; etching away unmasked portions of the exposed islands of monocrystalline silicon; epitaxially growing collector regions of monocrystalline silicon of lower impurity concentration but of the same-type conductivity as said subcollector regions on the etched surfaces of said subcollector regions; diffusing base regions of the opposite-type conductivity than said collector region into said collector region; diffusing emitter regions of the same-type conductivity as said collector regions into said base regions; and forming individual electrical contacts to said subcollector regions, said base regions, and said emitter regions.